(12) United States Patent
Trudeau et al.

(10) Patent No.: US 6,208,510 B1
(45) Date of Patent: Mar. 27, 2001

(54) INTEGRATED TEST CELL COOLING SYSTEM

(75) Inventors: Paul Trudeau, Sunnyvale; Gerald L. Forbes, Mountain View, both of CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/360,180

(22) Filed: Jul. 23, 1999

(51) Int. Cl.[7] ........................................ H05K 7/20
(52) U.S. Cl. ............... 361/696; 165/80.3; 324/158.1; 361/701; 654/184
(58) Field of Search ............... 165/80.3, 104.14, 165/122; 174/15.1, 16.1; 361/688, 694–696, 698, 699, 701; 454/184; 324/158.1, 760, 765

(56) References Cited

U.S. PATENT DOCUMENTS

| | | |
|---|---|---|
| 5,644,248 | 7/1997 | Fujimoto . |
| 5,680,294 * | 10/1997 | Stora et al. ................... 361/695 |
| 5,767,690 | 6/1998 | Fujimoto . |
| 5,889,651 | 3/1999 | Sasaki et al. . |
| 5,978,218 * | 11/1999 | Fujimoto et al. ............. 361/696 |

* cited by examiner

Primary Examiner—Gregory Thompson
(74) Attorney, Agent, or Firm—Lance M. Kriesman

(57) ABSTRACT

A cooling unit is disclosed for cooling a plurality of spaced-apart circuit boards having elongated edges and disposed within an integrated test cell. The cooling unit includes a supply path for directing a cooled cooling medium between the plurality of circuit boards and in the direction of the elongated edges and a heat exchanger. The heat exchanger is disposed in a substantially vertical relationship above the circuit boards and has an input to receive a heated cooling medium from the circuit boards. The heat exchanger further includes a converter to convert the heated cooling medium to a cooled cooling medium, and an output for discharging the cooled cooling medium. A circulation unit is disposed proximate the heat exchanger output, and is operative to draw the heated cooling medium from between the circuit boards, through the heat exchanger and to recirculate the cooled cooling medium through a recirculation path. The recirculation path has a distal end coupled to the supply path to form a closed configuration.

13 Claims, 2 Drawing Sheets

INTEGRATED TEST CELL COOLING SYSTEM

FIELD OF THE INVENTION

The invention relates generally to automatic test equipment for testing semiconductor devices, and more particularly a cooling system for cooling an integrated test cell.

BACKGROUND OF THE INVENTION

Automatic test equipment provides semiconductor manufacturers the capability of individually testing each and every semiconductor device fabricated during production. The testing is usually carried out at both the wafer level and the packaged-device level to ensure operability of the devices before reaching the marketplace.

Modern semiconductor devices typically have anywhere from thirty-two to over one-thousand pins, generally requiring a corresponding number of channels in the semiconductor tester to thoroughly verify the operation of the device. Each channel usually comprises a signal path including the necessary pin electronics for sending and/or receiving test signals to and from a pin on the DUT. In conventional testers, to maximize component density and minimize the size of the tester, the channels are often formed on printed circuit boards resident within a testhead. The testhead is separated from the main body of the tester for coupling to the DUTs that are mounted on a prober or handler.

Because of the relatively high concentration of circuit boards within a conventional testhead, specialized cooling systems are generally employed to maintain a stable thermal environment. One proposal for such a cooling system is found in U.S. Pat. No. 5,889,651 to Sasaki et al. This patent discloses a cooling system for a conventional testhead type of tester and employs an annular air duct disposed within a testhead housing. The duct abuts a plurality of radially disposed circuit boards and includes airways that project radially inwardly between adjacent boards. Each airway is formed with nozzles that direct air perpendicular to the boards to effect cooling.

While this proposal would appear to work well for its intended applications, the elaborate ducting takes up valuable space within the testhead, contributing to a larger overall footprint for the tester. Moreover, because of the direct impingement of the airflow perpendicular to the boards, the capacity of the cooling fans would appear to be relatively large in order to overcome the resistive effects of the ducting and the nozzles. Consequently, from a material and operating cost perspective, the Sasaki proposal appears to have several undesirable drawbacks.

In an effort to overcome the direct-impingement drawback, two similar proposals disclosed in U.S. Pat. Nos. 5,644,248 and 5,767,690 to Fujimoto employ a linear airflow construction. Like the Sasaki disclosure, the Fujimoto systems are employed in a conventional testhead and include an air duct disposed inside the testhead housing. A plurality of fans and heat exchangers are used to circulate air between parallel arrays of circuit boards in a horizontal circular path.

Although the Fujimoto proposals also appear beneficial for their intended purposes, they suffer from many of the drawbacks associated with the Sasaki system. This includes the additional air duct that displaces valuable circuit board space, and the implementation of a horizontal air path. Due to the horizontal nature of the airflow path, multiple fans and heat exchangers appear to be required to ensure adequate airflow across the circuit boards. The additional fans and heat exchangers undesirably adds both complexity and cost to the system.

While the cooling systems described above exemplify the art for conventional testhead-type semiconductor testers, modern tester designs have begun employing integrated test cells that eliminate the separateness of the conventional testhead from the body of the tester. The test system takes advantage of the vertical space in a semiconductor manufacturers' clean room, dramatically improving the tester footprint. In effect, the circuit boards that couple to the DUT do so from within the tester, and are supported by the tester frame. Such a configuration is described in copending U.S. patent application Ser. No. 09/410,857, entitled "Integrated Test Cell", filed Oct. 1, 1999, assigned to the assignee of the present invention and expressly incorporated herein by reference.

What is needed and heretofore unavailable is a cooling system that minimizes costly components and correspondingly reduces operating costs to sufficiently cool arrays of circuit board assemblies in a semiconductor tester. Moreover, the need exists for such a cooling system that takes advantage of the vertical nature of an integrated test cell.

SUMMARY OF THE INVENTION

The cooling system of the present invention minimizes the costs attributable to semiconductor testing by minimizing expensive cooling componentry and maximizing the efficiency thereof. Moreover, the cooling system takes advantage of the vertical nature of an integrated test cell semiconductor tester to assist in minimizing such costs.

To realize the foregoing advantages, the invention in one form comprises a cooling unit for cooling a plurality of spaced-apart circuit boards having elongated edges and disposed within an integrated test cell. The cooling unit includes a supply path for directing a cooled cooling medium between the plurality of circuit boards and in the direction of the elongated edges and a heat exchanger. The heat exchanger is disposed in a substantially vertical relationship above the circuit boards and has an input to receive a heated cooling medium from the circuit boards. The heat exchanger further includes a converter to convert the heated cooling medium to a cooled cooling medium, and an output for discharging the cooled cooling medium. A circulation unit is disposed proximate the heat exchanger output, and is operative to draw the heated cooling medium from between the circuit boards, through the heat exchanger and to recirculate the cooled cooling medium through a recirculation path. The recirculation path has a distal end coupled to the supply path to form a closed configuration.

In another form, the invention comprises a cooling system for use in an integrated test cell having respective first and second card cages including respective sets of spaced-apart circuit boards. The cooling system includes respective first and second cooling units corresponding to the first and second card cages. Each of the cooling units include a supply path for directing a cooled cooling medium between the set of circuit boards. A heat exchanger is disposed in a substantially vertical relationship above the set of circuit boards and has an input to receive a heated cooling medium from the circuit boards. The heat exchanger further includes a converter to convert the heated cooling medium to a cooled cooling medium, and an output for discharging the cooled cooling medium. A circulation unit is disposed proximate the heat exchanger output, and is operative to draw the heated cooling medium from between the circuit boards, through the heat exchanger and to recirculate the cooled cooling medium through a recirculation path. The recirculation path has a distal end coupled to the supply path to form a closed configuration.

In yet another form, the invention comprises a method of cooling a plurality of spaced-apart circuit boards disposed within a sealed housing of an integrated test cell. The method includes the steps of directing a cooled cooling medium along a substantially vertical supply path in the direction of and between the plurality of circuit boards to transfer heat generated by the circuit boards into the cooling medium to form a heated cooling medium; exchanging heat from the heated cooling medium to generate the cooled cooling medium; and recirculating the cooled cooling medium back to the plurality of circuit boards along a substantially vertical recirculation path.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Semiconductor manufacturers are increasingly focussing on attempts to maximize available space within tightly controlled clean rooms. To satisfy this desire, at least one automatic test equipment construction, manufactured by Teradyne Inc., of Agoura Hills, Calif., provides an integrated test cell to minimize the horizontal footprint of the tester, thereby maximizing the utilization of the clean room.

Figure 1:
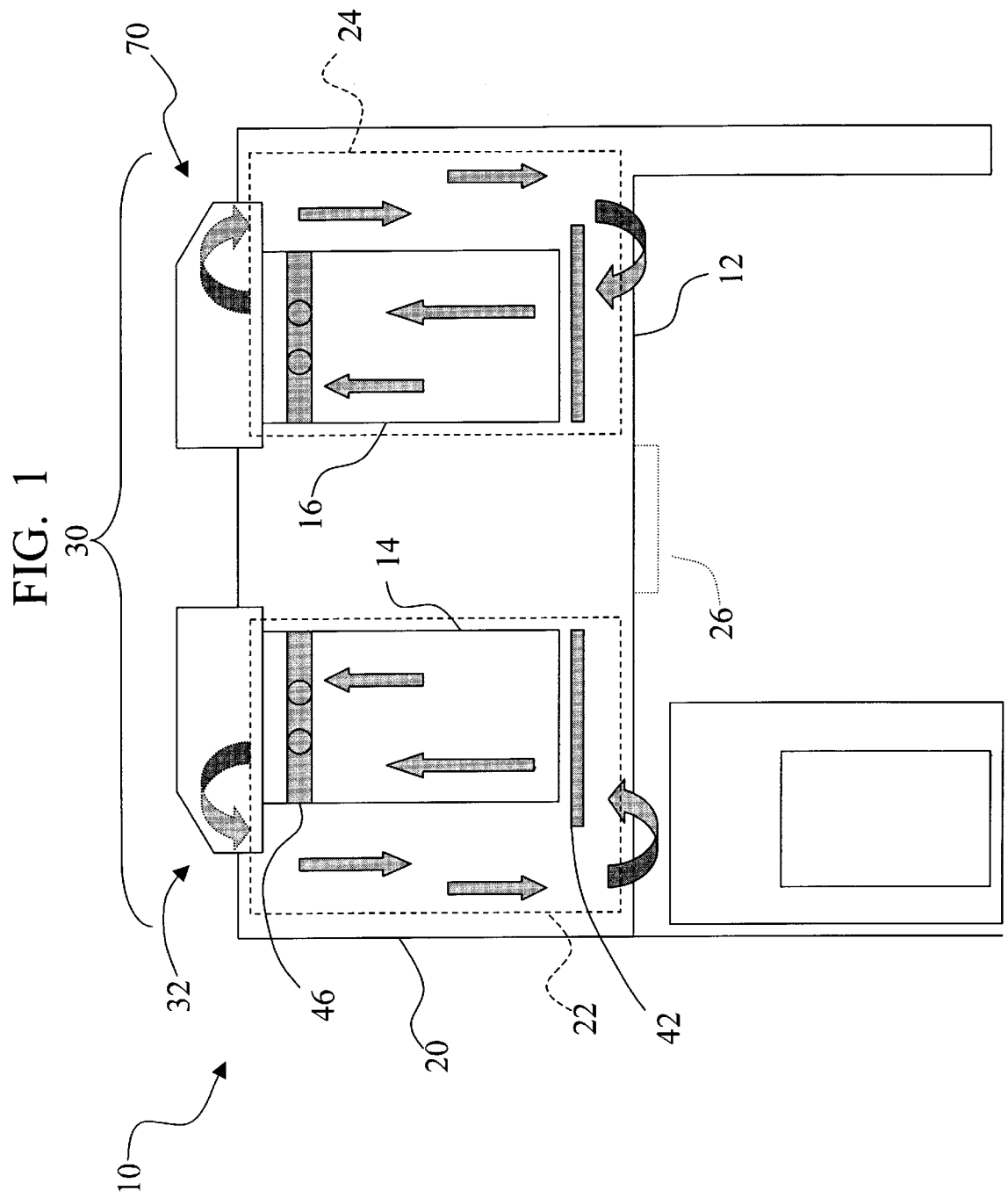
FIG. 1 is a block diagram of a frontal view of an integrated test cell incorporating the cooling system of the present invention.
Figure 2:
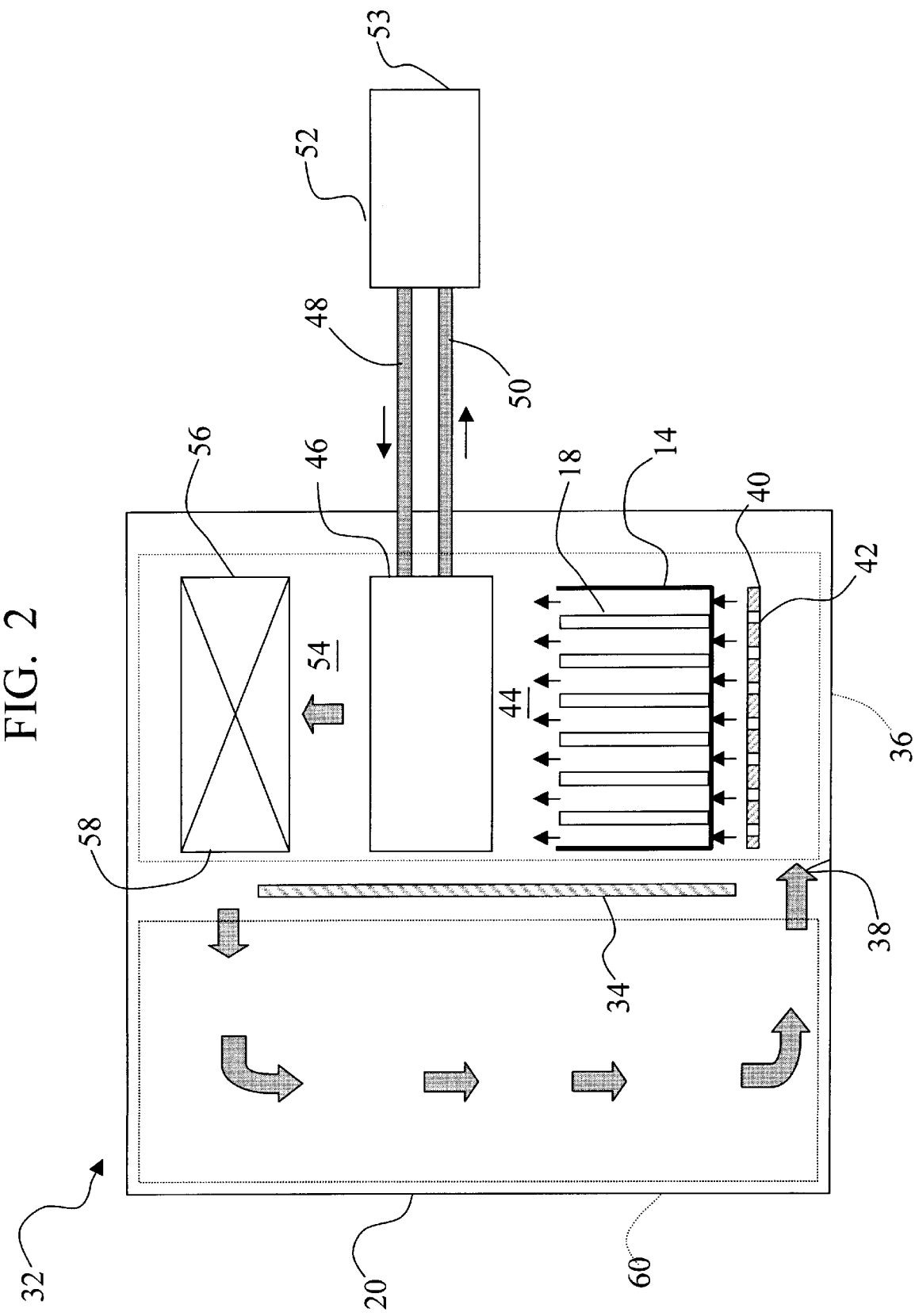
FIG. 2 is a partial frontal view of the first cooling unit of FIG. 1.

Referring now to FIG. 1, an integrated test cell 10 is shown that employs a self-supporting frame 12 to carry a pair of card cage assemblies 14 and 16. The frame is more fully described in copending U.S. patent application Ser. No. 09/410,857, titled "Integrated Test Cell", and previously referenced herein. Each card cage assembly includes a plurality of spaced-apart pin electronics boards 18 (FIG. 2). The boards each have elongated edges and mount electronic components that, during operation, dissipate substantial amounts of heat.

To isolate the interior of the tester from the clean room environment, surrounding the frame is a housing 20. This isolation is important to allow the semiconductor manufacturer to tightly control thermal and particle parameters within the clean room. The housing cooperates with the frame 12 to define respective compartments 22 and 24 for positioning each card cage, and providing additional space for airflow. The compartments are substantially isolated from one another and are disposed on opposite sides of an interface area 26.

In order to control the buildup of heat generated by the circuit board components, the integrated test cell employs a closed cooling system 30. The cooling system, according to one embodiment of the present invention, includes a pair of cooling units 32 and 70 that utilize inexpensive componentry to effect linear airflow cooling. Substantially vertical flowpaths enable the system to conveniently harness the beneficial effects of gravity on the gaseous cooling media.

Referring more particularly to FIG. 2, the first cooling unit 32 includes a divider 34 disposed in the compartment to define respective supply and recirculation paths 36 and 60. The supply path includes a lower portion, at 38, that communicates with the recirculation path. Disposed beneath the card cage 14 and in the lower portion of the supply path is a cooling medium distributor 40. The distributor comprises a metallic plate formed with a plurality of apertures 42 for spreading out the coolant flow prior to entry into the card cage area. The top of the card cage area communicates with a plenum space 44 that allows the heated airflow exiting the card cages to mix and enter and distribute equally into the heat exchanger 46.

The heat exchanger 46 is of conventional construction and employs a circulating liquid coolant such as treated water to extract heat from the air distributed in the plenum space 44. The heat exchanger employs a three-pass radiator having respective influent and effluent lines 48 and 50 with an approximate coolant flow of around 15 GPM. The influent and effluent lines couple to a thermal controller 52 for effecting a liquid-liquid heat transfer between the liquid coolant and factory chilled water introduced into the controller at 53 (FIG. 2). The factory chilled water cycles through the controller at a flowrate of approximately 18GPM, and at a chilled temperature in the range of around 4–17 degrees C. The thermal controller conveniently provides a control mechanism for regulating the cooling process within the integrated test cell 10.

Further referring to FIG. 2, disposed at the output of the heat exchanger 46 is a second plenum space 54 that allows the cooled air to be drawn equally from the volume of the heat exchanger before being drawn into the inlet of a circulation unit 56. The circulation unit comprises a low-power fan with an outlet 58 that directs the cooled air into the recirculation path 60. Because of the positioning of the fan at the output of the heat exchanger 46, the fan mechanical structure and electrical circuitry is exposed only to cooled air. This substantially increases the expected operating lifetime of the fan, and correspondingly improves the mean time between failure (MTBF) of the integrated test cell.

The recirculation path 60 communicates with the fan outlet 58 and directs the airflow in a downwardly manner to connect with the supply path 36. In this manner, the complete airflow circuit resides within the tester housing 20, and is sealed from the clean room environment. Those skilled in the art will recognize that because of the sealed nature of the cooling system 30, there are no intake or exhaust ports that undesirably affect the clean room temperature.

The second cooling unit 70 is formed substantially similar to the first cooling unit 32, with the thermal controller 46 forming a common connection between the two units.

In operation, the cooling units 32 and 70 function substantially independently to cool the respective card cages 14 and 16. For a relatively large cooling system, this modularity enables relatively fast repair should a problem arise. Quick repairs are important in minimizing the mean-time-to-repair (MTTR) parameter often associated with semiconductor testers. The commonality of the thermal controller also ensures that the respective temperatures within each card cage correspond closely.

For each cooling unit, at start-up, the fan 32 draws air from the second plenum area 54 disposed above the output of the heat exchanger 46. The air exiting the fan enters the recirculation path 60 and flows downwardly to the entrance to the supply path 36. As the airflow enters the supply path, the distributor apertures 42 create a distributed airflow directed between each of the circuit boards 18 disposed in the card cage 14. Since the positioning of the spaced-apart circuit boards results in the elongated edges running parallel to the direction of airflow, the distributed air meets little resistance in carrying away heat from the board components. This "linear cooling" process enables the use of a single low power fan to drive the airflow within a single cooling unit. the inventors have found that the pressure drop in the airflow paths is approximately 0.90 in H2O, and that the airflow through each card cage is approximately 1700 CFM. Overall, the cooling capacity is approximately 17 KW per card cage which corresponds to 34 KW for the entire system.

Air heated by the circuit boards 18 exits into the first plenum 44, where it is distributed and mixed before entering the heat exchanger radiator 46. The radiator extracts heat from the airflow, transferring it to the liquid coolant, which subsequently transfers the heat to the factory chilled water. By controlling the temperature of the liquid coolant, the temperature of the cooled air exiting the heat exchanger can be regulated within approximately +/−1 degree C. The cooled air then mixes within the second plenum 54, and drawn into the inlet of the fan 56, where it is subsequently directed back to the recirculation path 60.

Those skilled in the art will appreciate the many benefits and advantages afforded by the present invention. Of particular importance is the substantially vertical nature of the recirculation and supply paths within the tester. To assist the low-powered fan in circulating the airflow along the vertically disposed airflow paths, the inventors have conveniently utilized the effect of gravity on the heated and cooled air. By implementing the principle that heated air (less dense) rises, and chilled air (more dense) falls, the power required by the fan is minimized, resulting in significant cost savings to the tester user. This also saves costs by minimizing the number of fans and heat exchangers required for sufficient cooling of the tester.

Moreover, because the tester housing provides a sufficient seal to isolate the interior of the tester from the clean room environment, additional ducting that undesirably takes up tester space and increases the complexity of the cooling system is not required.

While the invention has been particularly shown and described with reference to the preferred embodiments thereof, it will be understood by those skilled in the art that various changes in form and detail may be made therein without departing from the spirit and scope of the invention.

What is claimed is:

1. A cooling unit for cooling a plurality of spaced-apart circuit boards having elongated edges, said circuit boards disposed within an integrated test cell, said cooling unit including:
    a supply path for directing a cooled cooling medium between said plurality of spaced-apart circuit boards and in the direction of said elongated edges;
    a heat exchanger disposed in a substantially vertical relationship above said plurality of spaced-apart circuit boards and having an input to receive a heated cooling medium from said plurality of spaced-apart circuit boards, a converter to convert said heated cooling medium to a cooled cooling medium, and an output for discharging said cooled cooling medium; and
    a circulation unit disposed above said heat exchanger output, and operative to draw said heated cooling medium from between said circuit boards, through said heat exchanger and recirculate said cooled cooling medium through a recirculation path, said recirculation path having a distal end coupled to said supply path to form a closed configuration.

2. A cooling unit according to claim 1 wherein:
    said cooled cooling medium and said heated cooling medium comprises air.

3. A cooling unit according to claim 1 wherein said plurality of spaced-apart circuit boards are disposed in a vertically upstanding configuration, and:
    said supply path feeds said cooled cooling medium from below said plurality of circuit boards.

4. A cooling unit according to claim 1 wherein:
    said supply path further includes a distributor disposed upstream of said plurality of circuit boards for equally distributing said cooled cooling medium thereacross.

5. A cooling unit according to claim 4 wherein:
    said distributor comprises a plate positioned normal to the direction of said elongated edges and formed with a plurality of equally sized and spaced-apart apertures.

6. A cooling unit according to claim 1 wherein:
    said supply path and said recirculation path share a substantially common divider wall.

7. A cooling unit according to claim 1 wherein:
    said heat exchanger comprises a liquid cooling unit utilizing factory chilled water.

8. A cooling unit according to claim 7 wherein:
    said converter is operable to transfer heat from said heated cooling medium to said factory chilled water.

9. A cooling unit according to claim 7 wherein:
    said liquid cooling unit further includes a temperature controller.

10. A cooling unit according to claim 1 wherein:
    said circulation unit comprises a fan.

11. A cooling unit according to claim 10 wherein:
    said fan is disposed above said heat exchanger output.

12. A cooling system for use in an integrated test cell having respective first and second card cages, said card cages including respective sets of spaced-apart circuit boards, said cooling system including:
    respective first and second cooling units corresponding to said first and second card cages, each of said cooling units including
        a supply path for directing a cooled cooling medium between said plurality of spaced-apart circuit boards and in the direction of said elongated edges;
        a heat exchanger disposed in a substantially vertical relationship above said plurality of spaced-apart circuit boards and having an input to receive a heated cooling medium from said plurality of spaced-apart circuit boards, a converter to convert said heated cooling medium to a cooled cooling medium, and an output for discharging said cooled cooling medium; and
        a circulation unit disposed above said heat exchanger output, and operative to draw said heated cooling medium from between said circuit boards, through said heat exchanger and recirculate said cooled cooling medium through a recirculation path, said recirculation path having a distal end coupled to said supply path to form a closed system.

13. A method of cooling a plurality of spaced-apart circuit boards disposed within a sealed housing of an integrated test cell, said method including the steps of:
    directing a cooled cooling medium along a substantially vertical supply path in the direction of and between said plurality of circuit boards to transfer heat generated by said circuit boards into said cooling medium to form a heated cooling medium;

exchanging heat from said heated cooling medium to generate said cooled cooling medium; and recirculating said cooled cooling medium back to said plurality of circuit boards along a substantially vertical recirculation path.

* * * * *